United States Patent
Kaneko

(10) Patent No.: US 9,845,991 B2
(45) Date of Patent: Dec. 19, 2017

(54) HEAT TREATMENT APPARATUS

(71) Applicant: TOKYO ELECTRON LIMITED, Tokyo (JP)

(72) Inventor: Hirofumi Kaneko, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 562 days.

(21) Appl. No.: 14/067,318

(22) Filed: Oct. 30, 2013

(65) Prior Publication Data
US 2014/0120487 A1 May 1, 2014

(30) Foreign Application Priority Data
Oct. 31, 2012 (JP) ................. 2012-240639

(51) Int. Cl.
*F27B 17/00* (2006.01)
*H01L 21/67* (2006.01)

(52) U.S. Cl.
CPC .... *F27B 17/0025* (2013.01); *H01L 21/67109* (2013.01); *H01L 21/67126* (2013.01)

(58) Field of Classification Search
CPC .................................. F27B 17/0025
See application file for complete search history.

(56) References Cited

U.S. PATENT DOCUMENTS 3,260,832 A * 7/1966 Johnson ............ F24C 15/04
219/741
5,207,573 A * 5/1993 Miyagi ............... C21D 1/34
432/152
5,368,648 A * 11/1994 Sekizuka ............ C23C 16/4401
118/733
5,578,132 A * 11/1996 Yamaga ............... C23C 16/4404
118/715
5,904,478 A * 5/1999 Weaver ............ H01L 21/67109
432/239

(Continued)

FOREIGN PATENT DOCUMENTS

JP 2008-177524 A 7/2008
JP 2008-199040 A 8/2008
TW 200802549 A 1/2008

OTHER PUBLICATIONS

"Translated_JP2008199040", Translation of JP2008199040, which was published Mar. 2008 by Honma, including clearly drawn Figures.*

*Primary Examiner* — Steven B McAllister
*Assistant Examiner* — Steven Anderson, II
(74) *Attorney, Agent, or Firm* — Nath, Goldberg & Meyer; Jerald L. Meyer

(57) ABSTRACT

Provided is a heat treatment apparatus, which includes: a cylindrical quartz reaction tube having a furnace opening and a bottom flange at a lower portion thereof; a flange holding part configured to hold the bottom flange of the reaction tube; and a lid including a metal lid and a quartz lid supported by the metal lid, the quartz lid being configured to close the furnace opening of the reaction tube. The quartz lid is fixed onto the metal lid by a support ring. The support ring is brought into contact with a bottom surface of the flange holding part so that a gap is defined between the quartz lid and the bottom flange. A sealing member is arranged outward from the gap in a radial direction.

4 Claims, 3 Drawing Sheets

(56) References Cited

U.S. PATENT DOCUMENTS

| | | | |
|---|---|---|---|
| 6,543,257 B1* | 4/2003 | Koaizawa | C03B 37/01486 65/489 |
| 6,988,886 B2* | 1/2006 | Takata | C23C 16/4409 118/725 |
| 2008/0090195 A1* | 4/2008 | Takahashi | F27D 99/0073 432/250 |
| 2009/0197409 A1* | 8/2009 | Morita | C23C 16/4401 438/680 |
| 2010/0050945 A1* | 3/2010 | Morita | C23C 16/4412 118/733 |

* cited by examiner phrase# HEAT TREATMENT APPARATUS

CROSS-REFERENCE TO RELATED APPLICATION

This application claims the benefit of Japanese Patent Application No. 2012-240639, filed on Oct. 31, 2012, in the Japan Patent Office, the disclosure of which is incorporated herein in its entirety by reference.

TECHNICAL FIELD

The present disclosure relates to a heat treatment apparatus.

BACKGROUND

In manufacturing semiconductor devices, various processes are used to heat treat an object to be processed, for example, a semiconductor wafer. The heat treatment includes oxidation, diffusion, chemical vapor deposition (CVD), and annealing. For example, a vertical heat treatment apparatus may be used to heat treat a plurality of wafers at one time.

In general, the vertical heat treatment apparatus includes a reaction tube provided in a heat treatment furnace and a lid installed to be vertically movable to open and close a furnace opening of the reaction tube. The furnace opening of the reaction tube is sealed by the lid.

In general, the reaction tube is made of quartz, and the lid is made of metal. An O-ring that protrudes from the lid is brought into contact with the reaction tube. When the quartz reaction tube is sealed by the metal lid, a gap is defined between the quartz reaction tube and the metal lid.

In another arrangement, a metal outer lid part supports an inner lid. The inner lid includes a quartz inner lid part positioned near a reaction tube. An O-ring is located between the quartz inner lid part and the reaction tube which can be made of quartz. When the reaction tube is sealed by the quartz inner lid part, the reaction tube is brought into contact with the lid.

In the vertical heat treatment apparatus, when the furnace opening of the reaction tube is sealed by the lid as described above, a bottom flange of the reaction tube is sealed by the lid.

However, since among the reaction tube and the lid, at least the reaction tube is made of quartz, when the lid is brought into contact with the bottom flange of the reaction tube, quartz particles may be generated as they are used more frequently. Thus, such quartz particles may sometimes be introduced into the reaction tube.

In addition, if there is a gap between the reaction tube and the lid to prevent the reaction tube from being brought into contact with the lid, a corrosive gas such as a cleaning gas may be introduced through the gap, thereby corroding other metal parts. Further, even though an inert gas supply unit is provided to prevent the corrosive gas from being introduced through the gap, when a sufficient gap is not formed because the amount of deformation of a sealing member is miscalculated, a reverse diffusion of the corrosive gas occurs, thus corroding the other metal parts.

SUMMARY

The present disclosure provides a heat treatment apparatus which is capable of preventing a reaction tube from being directly brought into contact with a lid and preventing a sealing member from being damaged, when a furnace opening of the reaction tube is sealed by the lid.

According to some embodiments of the present disclosure, provided is a heat treatment apparatus, which includes: a cylindrical quartz reaction tube having a furnace opening and a bottom flange at a lower portion thereof; a flange holding part configured to hold the bottom flange of the reaction tube; and a lid including a metal lid and a quartz lid supported by the metal lid, the quartz lid being configured to close the furnace opening of the reaction tube. The quartz lid is fixed onto the metal lid by a support ring. The support ring is brought into contact with a bottom surface of the flange holding part so that a gap is defined between the quartz lid and the bottom flange. A sealing member is arranged outward from the gap in a radial direction.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 2:
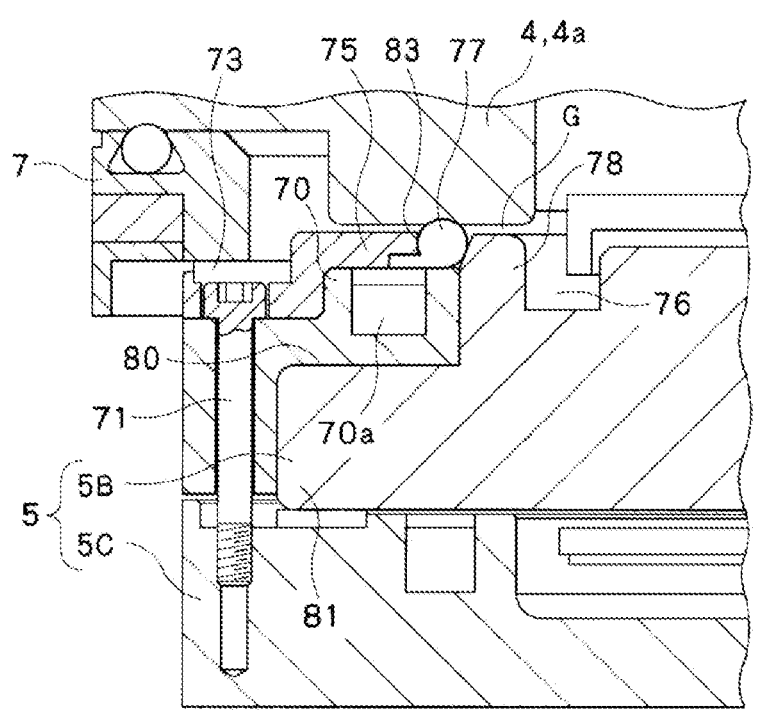
FIG. 2 is an enlarged sectional view showing a bottom flange of a reaction tube held by a flange holding part.
Figure 3:
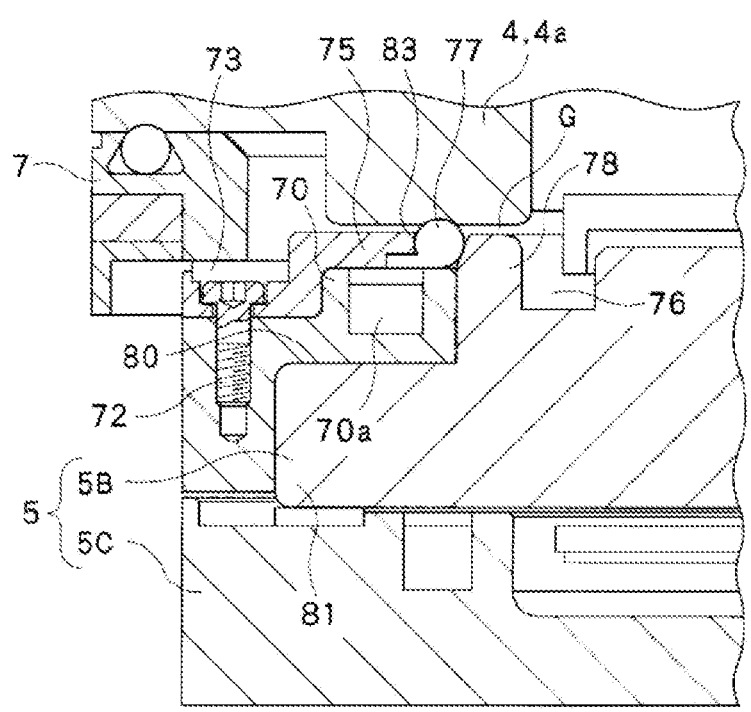
FIG. 3 is an enlarged sectional view showing another bottom flange of the reaction tube held by the flange holding part.

Hereinafter, a heat treatment apparatus according to an embodiment of the present disclosure will be described in detail with reference to FIGS. 1 to 3.

Figure 1:
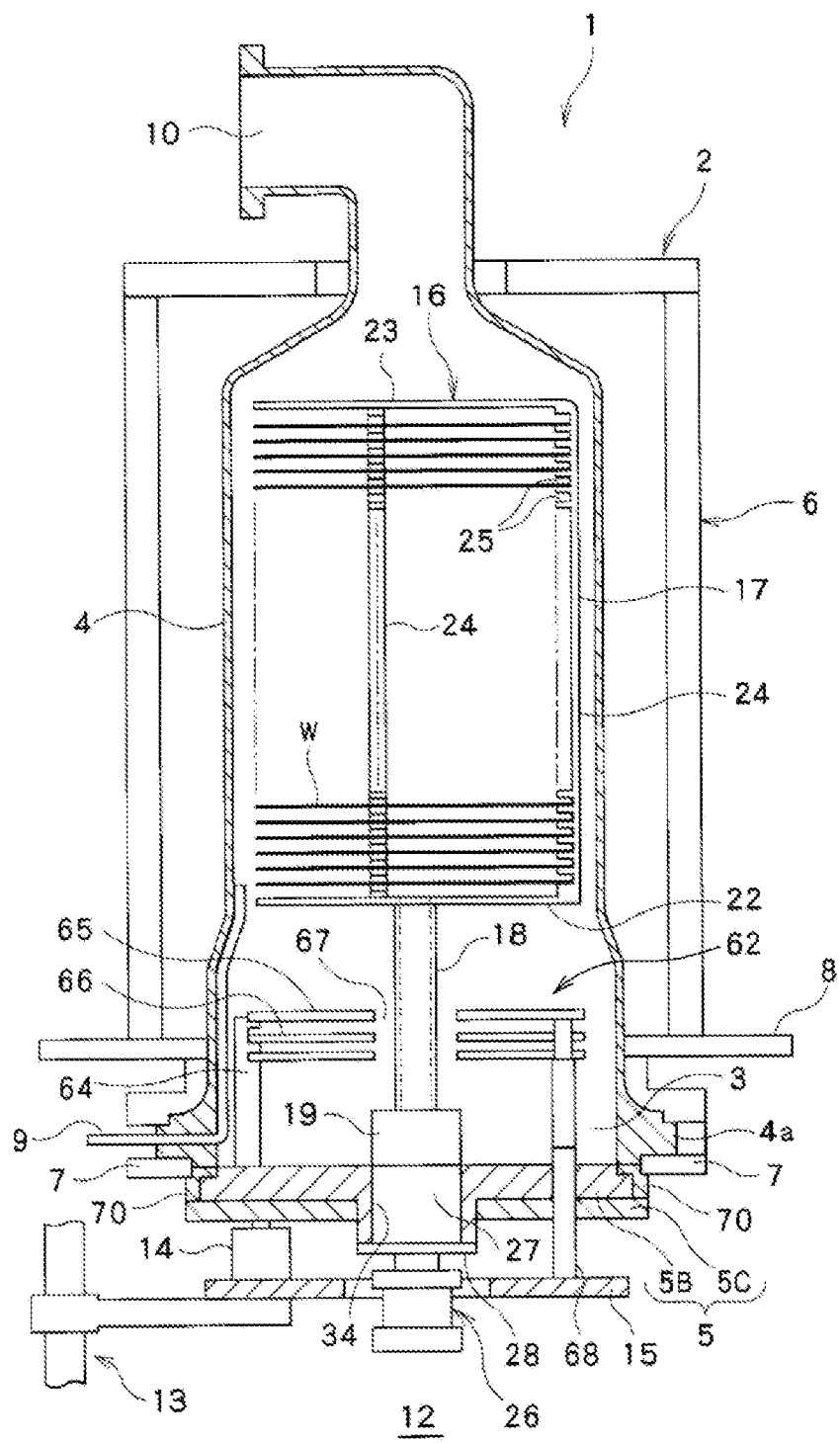
FIG. 1 is a longitudinal sectional view of a heat treatment apparatus according to an embodiment of the present disclosure.

In FIG. 1, a vertical heat treatment apparatus 1 according to an embodiment of the present disclosure includes a vertical heat treatment furnace 2. The heat treatment furnace 2 accommodates objects to be processed (e.g., semiconductor wafers W) to perform a predetermined treatment such as an oxidation treatment thereon. The heat treatment furnace 2 includes a cylindrical reaction tube 4 having an opened lower portion as a furnace opening 3, a vertically-movable circular lid 5 configured to open and close the furnace opening 3 of the reaction tube 4, and a heater 6 which is installed around the reaction tube 4 and is equipped with a heating resistor to heat the interior of the reaction tube 4 at a predetermined temperature, e.g., 300 to 1200 degrees C. The reaction tube 4 is made of, e.g., quartz, and serves as a lengthwise long processing chamber.

The reaction tube 4 is a single tube. The reaction tube 4 includes an outward flange (bottom flange) 4a formed on a lower end thereof. The bottom flange 4a is held by a flange holding part 7 at a lower portion of a base plate 8. In this configuration, the reaction tube 4 extends downward through the base plate 8. The heater 6 is located on the base plate 8.

A plurality of gas introduction pipes 9 through which a processing gas or an inert gas for purging is introduced into the reaction tube 4, is located in the bottom flange 4a of the reaction tube 4. Herein, the plurality of gas introduction pipes 9 is shown as one for the sake of simplicity. The gas introduction pipes 9 are connected to respective pipes of a gas supply system (not shown). In addition, a top portion of the reaction tube 4 is gradually decreased in diameter so as to form an exhaust port 10. The exhaust port 10 is connected to a pipe of an exhaust system equipped with a vacuum pump or a pressure control valve, which is capable of adjusting an internal pressure of the reaction tube 4. These components are not shown in drawings. Both the base plate 8 and the flange holding part 7 are made of metal, for example, a SUS metal. Among these, the flange holding part 7 holds the bottom flange 4a of the reaction tube 4.

A lower portion of the heat treatment furnace 2 corresponds to a working area (loading area) 12 through which a heat treatment boat 16 (which will be described later) mounted on the lid 5 is loaded into or unloaded from the reaction tube 4, or wafers W are transferred to the boat 16. The working area 12 is provided with an elevation mechanism 13 configured to vertically move the lid 5 so as to load or unload the boat 16 into or from the reaction tube 4.

The lid 5 includes a lid 5C made of metal, e.g., a SUS metal, and a lid 5B made of quartz. The quartz lid 5B is supported by the metal lid 5C and is configured to seal (or close) the furnace opening 3 of the reaction tube 4. The lid 5, which is provided with the metal lid 5C and the quartz lid 5B, is held by a holding plate 15 through a plurality of buffer mechanisms 14. Herein, the plurality of buffer mechanisms 14 is shown as one for the sake of simplicity. The holding plate 15 is connected to the elevation mechanism 13. The quartz lid 5B of the lid 5 is configured to close the furnace opening 3. A rotation mechanism 26 having a rotation shaft 27 configured to rotate the boat 16 is installed in a lower central portion of the lid 5.

Next, a configuration in which the furnace opening 3 of the reaction tube 4 is closed by the lid 5 will be described later.

The boat 16, which is made of, e.g., quartz, includes a boat main body 17 and a single leg part 18 configured to support the boat main body 17. The boat main body 17 is configured to horizontally support a plurality of (e.g., 75 to 100) wafers W having a large diameter (e.g., 300 mm) at certain vertical intervals in multiple stages. Both the boat main body 17 and the single leg portion 18 are integrated together. In addition, the single leg part 18 of the boat 16 is connected to the rotation shaft 27 which rotates the wafers W in their circumferential direction.

The boat main body 17 includes a plurality of pillars 24 which is installed between a bottom plate 22 and a ceiling plate 23. The pillars 24 and the bottom plate 22 and the ceiling plate 23 are integrally bonded by, e.g., welding. The pillars 24 are disposed at certain intervals along the circumferential direction to surround the wafers W. In the boat 16 shown in FIG. 1, the left side in which none the pillars 24 are installed is used as an opening through which the wafers W are transferred by a transfer mechanism (not shown). A plurality of groves 25 by which the plurality of the wafers W is held in multiple stages, is formed in each of the pillars 24. In some embodiments, the size of the single leg portion 18 falls within a range of 30 to 50 mm in outer diameter and a range of 250 to 350 mm in height, including that of a lower flange 19.

The rotation mechanism 26 includes the rotation shaft 27 described above and a cylindrical housing 28. The housing 28 is integrally installed with the lid 5 at the lower central portion of the lid 5 so as to rotatably support the rotation shaft 27. A cylindrical rotation body (not shown) having a bottom is rotatably installed at a lower periphery of the housing 28. A rotation axis of the rotation body is coaxially mounted at the axial center of the rotation mechanism 26. The portion of the rotation axis that protrudes from the bottom center of the rotation body is air-tightly inserted into the housing 28 through a sealing member such as an O-ring or a magnetic fluid seal.

The rotation body is connected to a motor used as a rotation drive unit by a belt (not shown) so that the rotation axis is driven. A shaft hole 34 through which the rotation shaft 27 is passed is formed in the central portion of the quartz lid 5B of the lid 5.

Further, as shown in FIG. 1, a furnace opening heating mechanism 62 used as a furnace opening heat retaining means is fixed onto the quartz lid 5B of the lid 5. The furnace opening heating mechanism 62 mainly includes a plurality of pillars 64 which is installed upright on an upper surface of the quartz lid 5B at certain intervals in its circumferential direction, a plate-shaped heating resistor 65 which is installed horizontally over upper ends of the pillars 64, a plurality of (e.g., two) heat shield plates 66 which is installed over the pillars 64 at certain intervals below the heating resistor 65.

The pillars 64 and the heat shield plates 66 are made of, e.g., quartz. Through holes 67 through which the single leg portion 18 including the lower flange 19 of the boat 16 is passed, are formed in the heating resistor 65 and the heat shield plates 66. In addition, a pipe 68 into which a cable configured to supply electric power to the heating resistor 65 is inserted is installed on the holding plate 15 in such a manner that the pipe 68 air-tightly penetrates the lid 5.

Next, a configuration in which the furnace opening 3 of the reaction tube 4 is closed by the lid 5 will be described with reference to FIGS. 1 to 3.

As described above, the lid 5 includes the metal lid 5C and the quartz lid 5B which is supported by the metal lid 5C. The quartz lid 5B closes (or seals) the furnace opening 3 of the reaction tube 4.

In addition, an installation structure of the quartz lid 5B and the metal lid 5C constituting the lid 5 will be described.

An annular concave portion 80, which is more inwardly concave than a peripheral portion of a lower opening end of the reaction tube 4, is formed in an upper portion (upper half) of an outer periphery of the quartz lid 5B. A lower portion (lower half) of the outer periphery of the quartz lid 5B constitutes a flange portion 81. A metal support ring 70, which is positioned on the annular concave portion 80 to hold the flange portion 81 of the quartz lid 5B, is arranged in the metal lid 5C. A sealing member 77, which is brought into contact with a bottom surface of the lower opening end of the reaction tube 4, is disposed on an upper surface of the support ring 70. In addition, a coolant path (e.g., cooling water path) 70a for use in cooling the sealing member 77 is formed inside the support ring 70. Thus, the sealing member 77 is efficiently cooled by water flowing through the coolant path 70a.

The support ring 70 is of an approximately L-shape (with vertical and horizontal portions) in a vertical cross section and is also formed in an annular (ring) shape to cover (surround) the flange portion 81. The support ring 70 is detachably fixed onto the metal lid 5C by a plurality of screws 71 while holding the flange portion 81. An annular holding groove 83 for holding the sealing member 77 is formed in a cover ring 75 of the support ring 70. According to the vertical heat treatment apparatus configured as above, it is possible to prevent the lid 5 from being corroded and obtain improvement in durability of the sealing member 77.

In this embodiment, the plurality of screws 71 are mounted in the support ring 70 along the circumferential direction while penetrating the support ring 70 and the metal lid 5C. Further, the support ring 70 is configured to press the quartz lid 5B against the metal lid 5C at the outer periphery (see FIG. 2). In some embodiments, as shown in FIG. 3, screws 72 may be mounted only inside the support ring 70 without reaching the metal lid 5C.

When the furnace opening 3 of the reaction tube 4 is closed by the lid 5, the support ring 70 is brought into contact with a bottom surface of the flange holding part 7 through a buffering member 73 made of polyimide, which is arranged on top sides of the screws 71 (or 72). A gap G is defined between the quartz lid 5B and the bottom flange 4a of the reaction tube 4.

The sealing member 77 is of an approximately Q-shape in a vertical cross section and is fixed by pressing its lip portion onto the support ring 70 by the cover ring 75. The cover ring 75 is fixed to the support ring 70 by the screws 71 (or 72).

A circumferential groove 76 for blocking heat which is radiated outward from the central portion of the quartz lid 5B along the upper surface of the quartz lid 5B in a radial direction, is formed on the upper surface of the quartz lid 5B in a side of the sealing member 77 facing the central portion of the quartz lid 5B in the radial direction.

Also, a circumferential protrusion 78 is formed in the upper surface of the quartz lid 5B to protrude outside the circumferential groove 76 in the radial direction. The gap G which is defined between the quartz lid 5B and the bottom flange 4a of the reaction tube 4, is positioned above the circumferential protrusion 78.

In addition, the sealing member 77 arranged in the quartz lid 5B is heated by the internal heat of the reaction tube 4 which is radiated along the upper surface of the quartz lid 5B. In this embodiment, as described above, the circumferential groove 76 is formed in the quartz lid 5B so that the transition of the internal heat from the central portion of the quartz lid 5B toward the sealing member 77 is prevented. Further, it is possible to more securely prevent the heating of the sealing member 77 by passing the cooling water through the coolant path 70a of the support ring 70.

Next, an operation of the heat processing apparatus configured as above will be described.

First, in the working area 12, the wafers W are transferred to the boat 16 disposed on the lid 5. Subsequently, the lid 5 is moved upward by the elevation mechanism 13 until the lid 5 is brought into contact with the lower opening end of the furnace opening 3. Thus, the furnace opening 3 is closed (sealed).

Simultaneously, the rotation body is rotated by the motor. With the rotation of the rotation body, the rotation shaft 27 is rotated so that the boat 16 is slowly rotated.

When the furnace opening 3 is closed by the lid 5, the buffering member 73 arranged in the support ring 70 is brought into contact with the bottom surface of the flange holding part 7 so that the gap G is defined between the circumferential protrusion 78 of the quartz lid 5B and the bottom flange 4a of the reaction tube 4.

With this configuration, even when the furnace opening 3 of the reaction tube 4 is closed by the lid 5, the quartz lid 5B and the bottom flange 4a made of quartz are not directly brought into contact with each other. Thus, it is possible to prevent quartz particles, which are generated when the quartz lid 5B is brought into contact with the bottom flange 4a, from being generated.

Further, since the processing gas in the reaction tube 4 is confined by the sealing member 77 installed outside the circumferential protrusion 78 in the radial direction, the processing gas does not leak. In addition, even when a highly corrosive cleaning gas flows, the support ring 70 does not corrode. Further, since the sealing member 77 has an approximate Q-shape cross section and is configured so that the lip portion is fixed by the covering ring 75, the sealing member 77 can be positioned outside the quartz lid 5B, i.e., a zone lightly affected by heat. Further, when the lid 5 is moved upward, the sealing member 77 is stably adhered onto the bottom flange 4a, thus preventing the sealing member 77 from being displaced from the bottom flange 4a.

In the course of the heat treatment for the wafers W, the internal heat of the reaction tube 4 radiates outward from the central portion of the quartz lid 5B in the radial direction along the upper surface of the quartz lid 5B. In this embodiment, the circumferential groove 76 is formed in the quartz lid 5B inward from the circumferential protrusion 78 (facing the bottom flange 4a of the reaction tube 4) in the radial direction. This prevents the internal heat of the reaction tube 4 from being radiated toward the sealing member 77. In addition, in this embodiment, the cooling water flows through the coolant path 70a of the support ring 70, thus preventing the sealing member 77 from being deteriorated by the heat.

As described above, according to the above embodiment, when the furnace opening 3 of the reaction tube 4 is closed by the lid 5, it is possible to prevent the quartz lid 5B from being directly brought into contact with the bottom flange 4a of the reaction tube 4 made of quartz, thus preventing the quartz particles from being generated. Further, as described above, the circumferential groove 76 is formed in the upper surface of the quartz lid 5B and the cooling water is flown through the coolant path 70a of the support ring 70, thus preventing the sealing member 77 from being deteriorated by the heat.

As described above, according to the above embodiment, a support ring is brought into contact with a bottom surface of a flange holding part so that a gap is defined between a quartz lid and a bottom flange, and a sealing member is arranged outward from the gap in a radial direction. With this configuration, when a furnace opening of a reaction tube is closed by the quartz lid, the reaction tube is not directly brought into contact with the quartz lid. Also, since the sealing member is arranged outward from the gap in the radial direction, the furnace opening of the reaction tube can be stably closed by the quartz lid. Further, it is possible to prevent metal parts constituting the furnace opening from being corroded.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus, comprising:
   a cylindrical quartz reaction tube having an opening and a bottom flange at a lower portion thereof;
   a flange holding part configured to hold the bottom flange of the reaction tube; and
   a lid including a metal lid and a quartz lid supported by the metal lid, the quartz lid being configured to close the opening of the reaction tube,
   wherein the quartz lid is fixed onto the metal lid by a support ring and a cover ring is fixed to the support ring,
   wherein a circumferential protrusion is formed in an upper surface of the quartz lid such that, when the opening is closed by the lid, an upper surface of the circumferential protrusion faces a lower surface of the bottom flange in a separated and parallel relationship between the upper surface of the circumferential protrusion and the lower surface of the bottom flange,
   wherein the support ring is brought into contact with a bottom surface of the flange holding part through the cover ring and a buffering member having a flattened cross-sectional shape, made of polyimide and arranged on top of a screw penetrating the cover ring, the support ring and the metal lid so that there is no contact between the quartz lid and the bottom flange and a gap is defined between the upper surface of the circumferential protrusion and the lower surface of the bottom flange,
   wherein a sealing member is arranged between the support ring and the bottom flange, and
   wherein, when the opening is closed by the lid, the sealing member makes contact with the support ring, the bottom flange and the circumferential protrusion.

2. The apparatus of claim 1, wherein the sealing member is of an approximately Q-shape in a cross section and includes a lip portion fixed by a cover ring, the cover ring being arranged on the support ring.

3. The apparatus of claim 1, wherein the support ring is made of metal and includes a cooling water path formed therein and configured to cool the sealing member.

4. The apparatus of claim 1, wherein the quartz lid includes a circumferential groove formed in an upper surface of the quartz lid radially inward from the sealing member in the radial direction of the reaction tube, the circumferential groove being configured to block heat which is radiated outward from a central portion of the quartz lid in the radial direction of the quartz lid along the upper surface of the quartz lid.

* * * * *